United States Patent [19]

Satoh et al.

[11] Patent Number: 4,949,347
[45] Date of Patent: Aug. 14, 1990

[54] DIAMOND LASER, METHOD FOR PRODUCING THE SAME, AND METHOD FOR ACTIVATING SUCH A LASER

[75] Inventors: Shuichi Satoh; Kazuwo Tsuji; Takeru Nakashima, all of Hyogo, Japan

[73] Assignee: Sumitomo Electric Industries, Ltd., Osaka, Japan

[21] Appl. No.: 306,813

[22] Filed: Feb. 3, 1989

[30] Foreign Application Priority Data

Feb. 5, 1988 [JP] Japan ................................. 63-26372

[51] Int. Cl.$^5$ ................................................ H01S 3/16
[52] U.S. Cl. ........................................ 372/41; 372/42; 423/446
[58] Field of Search ................ 372/41, 42, 39, 74, 372/75, 71, 72; 423/446

[56] References Cited

U.S. PATENT DOCUMENTS

| | | | |
|---|---|---|---|
| 3,970,960 | 7/1976 | Mollenauer | 372/42 |
| 4,124,690 | 11/1978 | Strong et al. | 423/446 |
| 4,174,380 | 11/1979 | Strong et al. | 423/446 |
| 4,638,484 | 1/1987 | Rand et al. | 372/42 |
| 4,880,613 | 11/1989 | Satoh et al. | 423/446 |

OTHER PUBLICATIONS

"Visible Color-Center Laser in Diamond", by S. C. Rand et al., Optics Letters, vol. 10, pp. 481 to 483, Oct. 1985.
"Optical Absorption and Luminescence in Diamond", by J. Walker Rep. Prog. Phys., vol. 42, 1979, p. 1979.

Primary Examiner—Frank Gonzalez
Attorney, Agent, or Firm—W. G. Fasse; D. H. Kane, Jr.

[57] ABSTRACT

A diamond laser formed of a synthetic diamond provides a high output power and a variable wavelength in the near infrared region. The maximum value of the optical density of H2 centers in the direction of the pumping light is in the range of 0.01 to 4. Laser action is caused in the range of 1000 to 1400 nm by an external pumping light at 650 to 950 nm. Such a diamond laser is produced by preparing a synthetic Ib type diamond having a nitrogen concentration within the range of $1 \times 10^{17}$ to $8.5 \; 10^{19}$ atoms/cm$^3$, subjecting this synthetic diamond to an electron irradiation with a dose of not less than $5 \times 10^{17}$ electrons/cm$^2$, and heat-treating the synthetic diamond in a vacuum of not more than 1 Torr or in an inert gas atmosphere and at a temperature within the range of 1400° to 1850° C. If the threshold value of the pumping light intensity necessary for causing laser action is Ith then, to make the pumping light intensity I greater than Ith throughout the laser crystal, it is important, that the maximum value of the optical density of H2 is within the range between 0.01 and 4.

7 Claims, 5 Drawing Sheets 4,949,347

DIAMOND LASER, METHOD FOR PRODUCING THE SAME, AND METHOD FOR ACTIVATING SUCH A LASER

FIELD OF THE INVENTION

The present invention relates to a laser diamond, to a method for producing such a laser, and to a method for activating the diamond laser. More particularly the invention relates to a diamond laser capable of operating at varying wavelengths in the near infrared region, to a method of producing such a laser and to a method of activating the same.

BACKGROUND INFORMATION

As for conventional diamond lasers, there is an example described in U.S. Ser. No. 673,304. The priority of U.S. Ser. No. 673,304 is claimed in International Patent Pulbication No. WO 86/03347. Reference may also be had to (Optics Letters), Vol. 10, p. 481 (Oct. 1985), in which pulsed laser action is effected at 530 nm using H3 color centers. In said laser, a natural diamond is used.

There has been no example which effects or suggests laser action using H2 color centers. However, properties of H2 centers are described, in "Reports on Progress in Physics", Vol. 42, pp. 1605-1659 (1979). Said "Reports on Progress in Physics" state that H2 color centers are not formed in type Ib diamond, that such H2 centers coexist with H3 centers, and that H2 centers have a low absorption in a natural type Ia diamond.

A conventional method of forming H2 color centers, as described in "Optical Absorption and Luminescence in Diamond", printed in "Reports on Progress in Physics", Vol. 42, p. 1648 (1979), comprises the step of heat-treating, at 627° C., natural Ia type diamond containing not less than $10^{19}$ nitrogen atoms/cm$^3$. In this case, heating at 227°-327° C. in dark places increases the H2 centers but decreases the H3 centers. Further, with the conventional method, it is impossible to in H2 centers from type IIa and type Ib diamonds.

In this connection, lasers which are capable of operating at varying wavelength in the near infrared region include the F center laser using alkali halide single crystals and the dye laser.

The lasing wavelength of said F center laser is in the ranges of 1400-1600 nm however, laser action is impossible and 2200-3300 nm in the range of 1000-1400 nm laser action is impossible. The wavelength range in which the dye laser oscillates continuously is 330-1050 nm and 1100-1200 nm. The range in which the laser output power is high is 400-800 nm, and the output power in the near infrared region is very low.

Thus, the conventional near infrared lasers have the following drawbacks:

(i) The wavelength cannot be varied, in the region of 1000-1400 nm;

(ii) The output power is very low in a dye laser having a tuning range of 1100-1200 nm.

SUMMARY OF THE INVENTION

It is an object of the present invention to provide a diamond as a laser medium heretofore not used, which produces a high output power and is capable of varying its wavelength in the near infrared region. Further, the invention also makes it possible to provide a small-sized, high output power laser capable of varying its wavelength.

In a laser diamond according to the invention, the maximum optical density of H2 centers in the direction of the pumping light in a synthetic diamond, is in the range of 0.01–4 and laser action is effected in the range of 1000–1400 nm by an external pumping light at 650–950 nm.

A first method of producing said laser diamond according to the invention comprises the steps of subjecting a synthetic type Ib diamond having a nitrogen concentration within the range of $1 \times 10^{17}$–$8.5 \times 10^{19}$ atoms/cm$^3$, to electron irradiation with a dose of not less than $5 \times 10^{17}$ electrons/cm$^2$, and heat-treating the diamond in the temperature range of 1400°–1850° C. in a vacuum at not more than 1 Torr or in an inert gas atmosphere.

A second method of producing said laser diamond according to the invention comprises the steps of subjecting a synthetic diamond having a nitrogen concentration within the range of $1 \times 10^{17}$–$8.5 \times 10^{19}$ atoms/cm$^3$, to electron irradiation with a dose of $5 \times 10^{17}$ electrons/cm$^2$, and heat treating the diamond under ultrahigh pressure and high temperature conditions at not less than 3.0 GPa and not less than 1500° C.

A method of activating said diamond laser comprises the step of using laser means as said external pumping light. In this case, a single or several semiconductor lasers may be used for said external pumping light.

For a laser action using H2 centers, it is important that the maximum value of the optical density of the H2 centers is between 0.01 and 4. The the optical density is given by the following formula.

$$\text{(Optical density)} = \ln (I_0/I)$$

where $I_0$ is the incident light intensity and I is the transmitted light intensity. In the case when there is no absorption, $I = I_0$. The optical density depends on the thickness of crystals. As a result, even if the material is the same the, optical density changes with the length of the crystal FIG. 1 shows a pumping light intensity distribution in a crystal with a thickness T when a pumping light with an optical density $I_0$ falls on the crystal. A solid line 1 indicates a typical distribution in which the optical density is within the range of the invention, and a dashed line 2 indicates a comparative example in which the optical density is greater than the limit value. I and Ia indicate their respective intensities on the transmission side. Ith indicates the threshold value required for laser oscillation.

As is clear from FIG. 1, in order to obtain a pumping light distribution in which the intensity is higher than Ith, the lower the optical intensity, the better. If the optical intensity is too high, the exciting light intensity becomes lower than Ith, which is necessary for laser action, in some crystals. Therefore, in such locations, laser action does not occur. To ensure that laser action occurs throughout the crystal, it is important that the pumping light intensity is not less than Ith throughout the crystal. To this end, the optical density must be not more than 4. On the other hand, setting the optical density at too low a value means that the color center concentration decreases. If the color center concentration is too low, stimulated emission does not occur, nor does laser action. That is, if the optical density of H2 centers is less than 0.01, laser action does not occur. In addition, as can be seen from the foregoing description, said optical density value becomes important when it is in the same direction as the incident light (pumping light).

For producing an center in the diamond according to the invention, the following steps a important:

(1) A synthetic type Ib diamond whose nitrogen concentration is within the range of $1 \times 10^{17}$ to $8.5 \times 10^{19}$ atoms/cm$^3$ is used;

(2) an electron irradiation with a dose of not less than $5 \times 10^{17}$ electrons/cm$^2$ is applied to said diamond.

Further, it is necessary to apply a heat treatment. There are two ways of heat treating diamonds which follows.

(3) Heating is effected at pressures of less than 1 Torr and in an inert gas atmosphere in the temperature range of 1400°–1850° C.

(4) a heat; or treatment is effected at ultrahigh pressures of not less than 3 GPa and at high temperature of not less than 1500° C.

Therefore, there are two production methods: one method comprises steps (1), (2) and (3), and another method comprises steps (1), (2) and (4). These methods differ greatly from the above mentioned conventional method in the following points:

(i) The type Ib diamond, in which it has heretofore been believed to be impossible to produce H2 color centers, is used;

(ii) the heat treating temperature is as high as 1400° C.;

(iii) diamond crystal whose nitrogen concentration is $1 \times 10^{17}$ to $8.5 \times 10^{19}$ atoms/cm$^3$ is used.

With regard to the nitrogen concentration range the following is noted. In the case where the nitrogen concentration in the diamond is not more than $1 \times 10^{17}$ atoms/cm$^3$, an H2 center will be formed with an optical density of not more than 0.01. In the case of not less than $8.5 \times 10^{19}$ atoms/cm$^3$, the optical density will be not less than 4. As for diamond crystal, small single crystals produced by the film growth method may be used, but it is preferable to use large-sized single crystals with high purity grown by the temperature gradient method.

With regard to the electron beam irradiation it will be noted that the present invention is characterized by a large amount of electron beam irradiation especially if the nitrogen concentration is small. In the case of a high nitrogen concentration, color centers can be formed by using a relatively small amount of electron irradiation. However, if the nitrogen concentration is small, a large amount of electron irradiation is needed. The lower limit is $5 \times 10^{17}$ electrons/cm$^2$. Preferably, it is $1 \times 10^{18}$ to $1 \times 10^{23}$ electrons/cm$^2$. In the case of not less than $1 \times 10^{23}$ electrons/cm$^2$, the defects caused by electron beams can no longer be eliminated by the annealing described above with regard to steps (3) and (4). It is preferable that the elecron irradiation energy be in the range of 0.5–5 MeV.

With regard to the heat treatments it is noted that centers are formed by such heat treatment. The temperture condition is important; in a vacuum, not less than 1400° C. is needed. However, if the temperature is not less than 1850° C., phase transformation takes place, whereby the diamond changes into graphite. Unless the heat treatment is effected at pressures of not more than 1 Torr, the diamond surface is graphitized. In this case an inert gas, such as Ar or H$_2$, may be used instead of vacuum.

In the case where H2 centers are formed at ultrahigh pressure a, heat treatment at a temperature of not less than 1500° C. is needed. At a pressure of 3.0 GPa simultaneously applied with the temperature treatment the diamond will not be graphitized even if heat treatment is effected at temperatures up to 2500° C.

H2 centers are formed in the early stage of such annealing, and thereafter H2 centers are decreased. Therefore, by suitably selecting the temperature condition and the time for this annealing, the concentration of H2 centers can be controlled.

For example, the absorption and emission spectrum of the H2 centers formed by the above method steps (1), (2), (4) are shown in FIGS. 2 and 3. A semiconductor laser with a wavelength of 780 nm was used as pumping light for the emission spectrum measurement. It has been found that these centers have a zerophonon line (ZPL) at a wavelength of 987 nm.

The absorption of H2 centers lies in the range of 600 to 992 nm. The absorption peak lies at 800 nm, and it is in the range of $800 \pm 150$ nm that the pumping light works efficiently. Lamp light may be condensed to form a pumping light source, but the use of laser light is preferable since it provides a higher conversion efficiency. If a semiconductor laser for example, a laser with wavelength at 780 nm, is used as an pumping light source, it is possible to decreases the size of the laser. However, for obtaining a small-sized high output power laser, it is preferable to use a plurality of lasers disposed in an array. Further, to vary the wavelength in the range of 1000–1400 nm, a wavelength tuning element, such as grating, prism or etalon will be inserted in a resonator or in an optical path.

Advantageous effects of the invention are seen in that according to the invention, H2 centers, which have heretofore been impossible to form in a type Ib diamond, can now be formed with a satisfactory reproducibility.

Further, the use of a laser according to the invention enables a laser action to be effected in the wavelength range of 1000–1400 nm.

The use of a semiconductor laser as an external pumping light source makes it possible to provide a small-sized high output power laser capable of varying its wavelength.

In addition, the present laser is effective for use in spectroanalysis, distance measurement, fine machining, or other purposes.

The foregoing and other objects, features, aspects and advantages of the present invention will become more apparent from the following detailed description of the present invention when taken in conjunction with the accompanying drawings.

Figure 1:
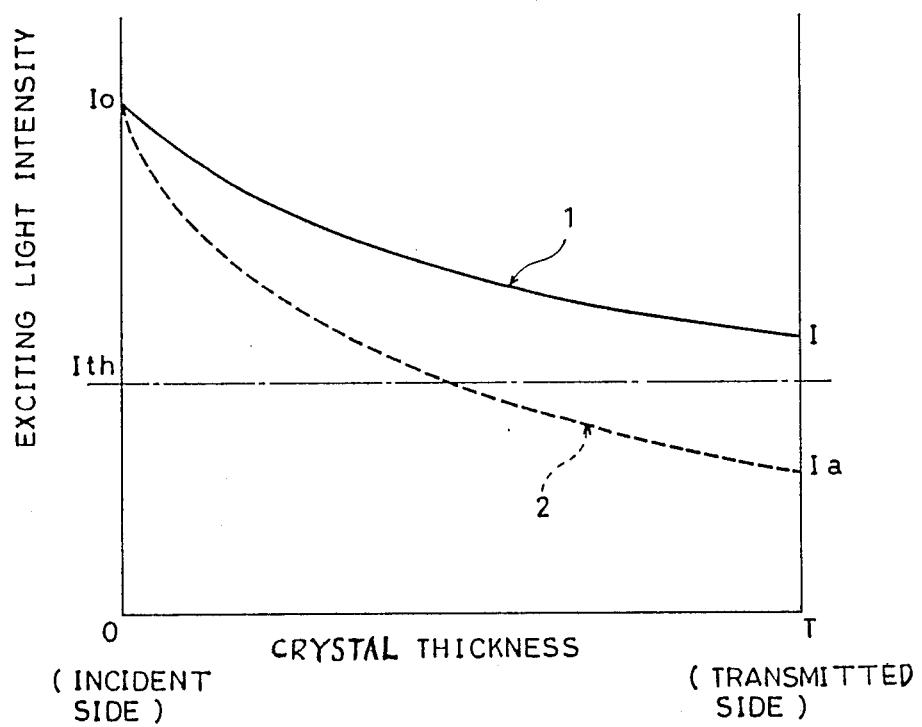
FIG. 1 is a graph showing the relation between the thickness of a laser crystal element and the pumping light intensity.
Figure 2:
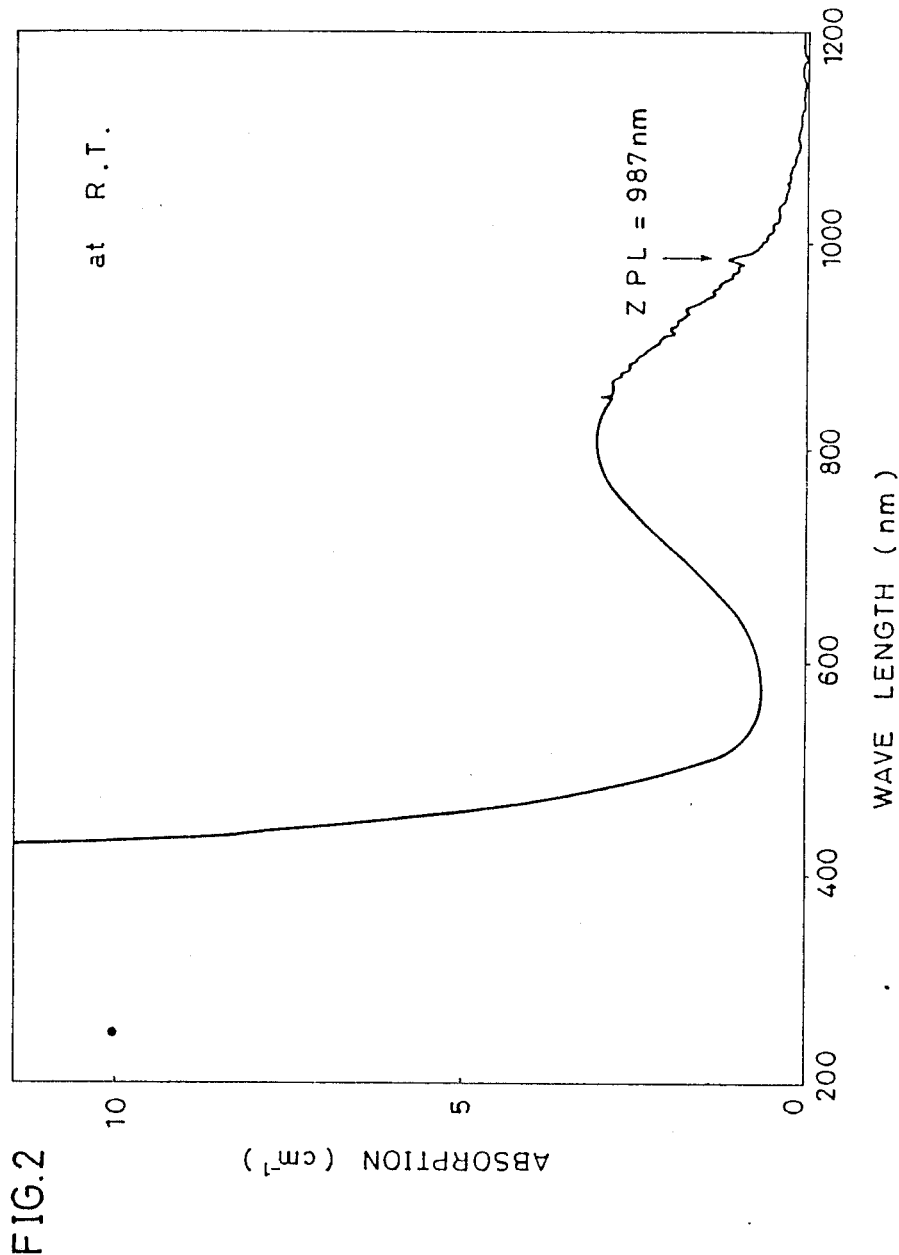
FIG. 2 is a graph showing an absorption spectrum of H2 centers at room temperature.
Figure 3:
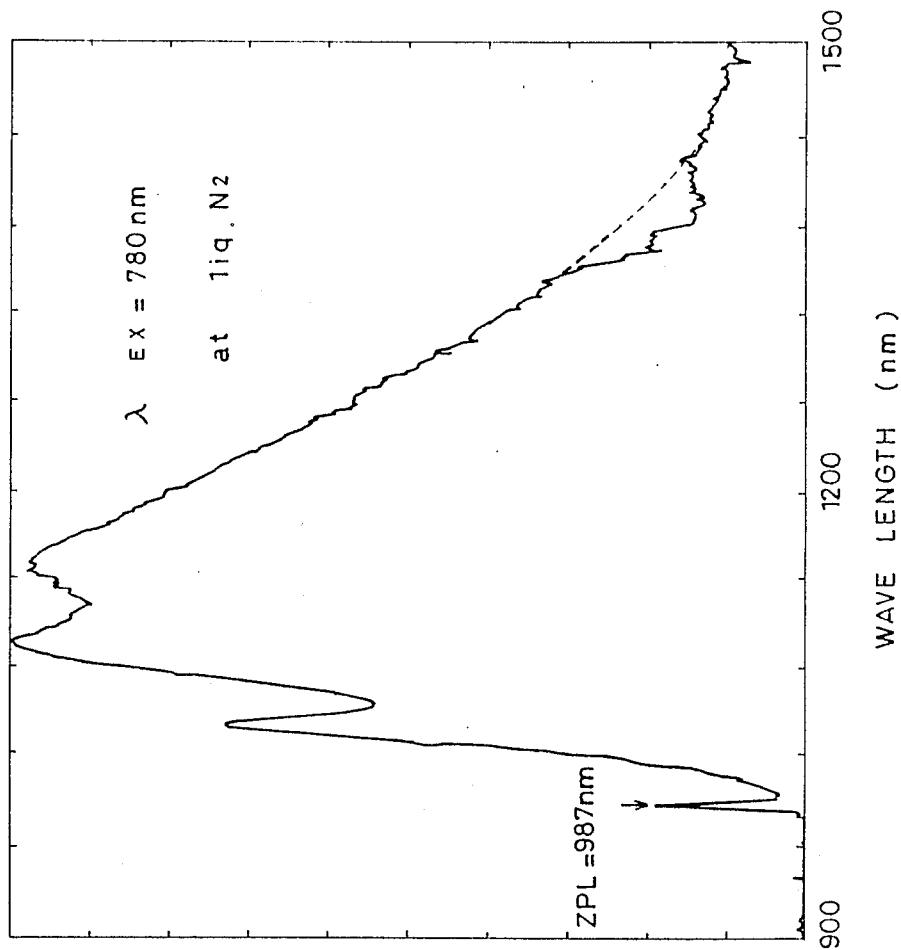
FIG. 3 is a graph showing an emission spectrum of an H2 center at the liquid nitrogen temperature.

BRIEF DESCRIPTION OF THE PREFERRED EMBODIMENTS AND OF THE BEST MODE OF THE INVENTION

Example 1

This example is an embodiment of the production method described in claim 2.

Nine pieces of type Ib diamonds synthesized by the temperature gradient method were prepared. These diamonds were cut into a size of 4 mm×4 mm×2 mm. The nitrogen concentrations were in the range of $5\times10^{16}$ to $1.7\times10^{20}$ atoms/cm$^3$. These samples were subjected to an electron irradiation to a dose of $1\times10^{17}$ to $1\times10^{23}$ electrons/cm$^2$ with an accelerating voltage of 3 MeV. Further, annealing was performed in the range of 1200°–1900° C. in a vacuum of 1 Torr. The annealing lasted for 5 hours. The results obtained are shown in Table 1.

Annealing was also carried out in an N$_2$ gas atmosphere dried in a dry column, instead of in a vacuum, and the same results were obtained.

TABLE 1

| Sample No. | 1 | 2 | 3 | 4 | 5 | 6 | 7 | 8 | 9 |
|---|---|---|---|---|---|---|---|---|---|
| Optical density | 0.005 | approximately 0 | approximately 0 | 0.01 | 0.3 | 4 | 6 | approximately 0 | impossible to measure |
| Nitrogen concentration (atoms/cm$^3$) | $5\times10^{16}$ | $5.1\times10^{18}$ | $5.1\times10^{18}$ | $1\times10^{17}$ | $5.1\times10^{18}$ | $8.5\times10^{19}$ | $1.7\times10^{20}$ | $1.7\times10^{19}$ | $1.7\times10^{19}$ |
| Amount of electron irradiation (electrons/cm$^2$) | $1\times10^{18}$ | $1\times10^{17}$ | $1\times10^{18}$ | $5\times10^{17}$ | $1\times10^{19}$ | $1\times10^{21}$ | $1\times10^{21}$ | $1\times10^{19}$ | $1\times10^{21}$ |
| Annealing temperature (°C.) | 1600 | 1600 | 1200 | 1400 | 1600 | 1850 | 1850 | 1850 | 1900 |
| Laser action | absent Comparative example | absent Comparative example | absent Comparative example | present Example of invention | present Example of invention | present Example of invention | absent Comparative example | absent Comparative example | absent Comparative example |

In the No. 9 sample, optical measurement was tried but failed because this diamond changed into graphite and turned to black.

In this experiment, the nitrogen concentration of diamonds was estimated from an absorption coefficient of 1130 cm$^{-1}$ by infrared spectral analysis. Further the, optical density was measured by an instrument for spectroanalysis in the visible range. The laser action was caused using a laser system shown FIG. 4, wherein the numeral 11 denotes a laser crystal; 12 denotes a total reflection mirror; 13 denotes a translucent mirror; 14 denotes a prism; 15 denotes an argon ion laser; 16 denotes a dye laser; 17 denotes mirror for changing the optical path; 18 denotes a filter; and 19 denotes a measuring instrument. The solid line A denotes pumping light and broken line B denotes laser light.

Example 2

This example is an embodiment of the production method described in claim 3.

Four pieces of Ib type diamonds made by the temperature gradient method were prepared as rough diamonds. These rough diamonds were cut into a size of 4 mm×4 mm×2 mm. The nitrogen concentration was in the range of $5\times10^{18}$ atoms/cm$^3$. These samples were subjected to electron irradiation at a dose of $1\times10^{19}$ electrons/cm$^2$ with an accelerating voltage of 2 MeV. Further, 15 hours of annealing was carried out at varying temperature in the range of 1300° to 2500° C. at a ultrahigh pressure of 3.0 GPa.

The results obtained are shown in Table 2.

TABLE 2

| Sample No. | 11 | 12 | 13 | 14 |
|---|---|---|---|---|
| Optical density | 0.005 | 0.2 | 2.5 | 1.6 |
| Ultrahigh pressure high temperature annealing temperature (°C.) | 1300° C. | 1500° C. | 2000° C. | 2500° C. |
| Laser action | absent Comparative Example | present Example of invention | present Example of invention | present Example of invention |

In this experiment, measurements of the nitrogen concentration in the diamonds of the, optical density, and of the laser action were made by the same methods as in Example 1 described above.

Example 3

Figure 4:
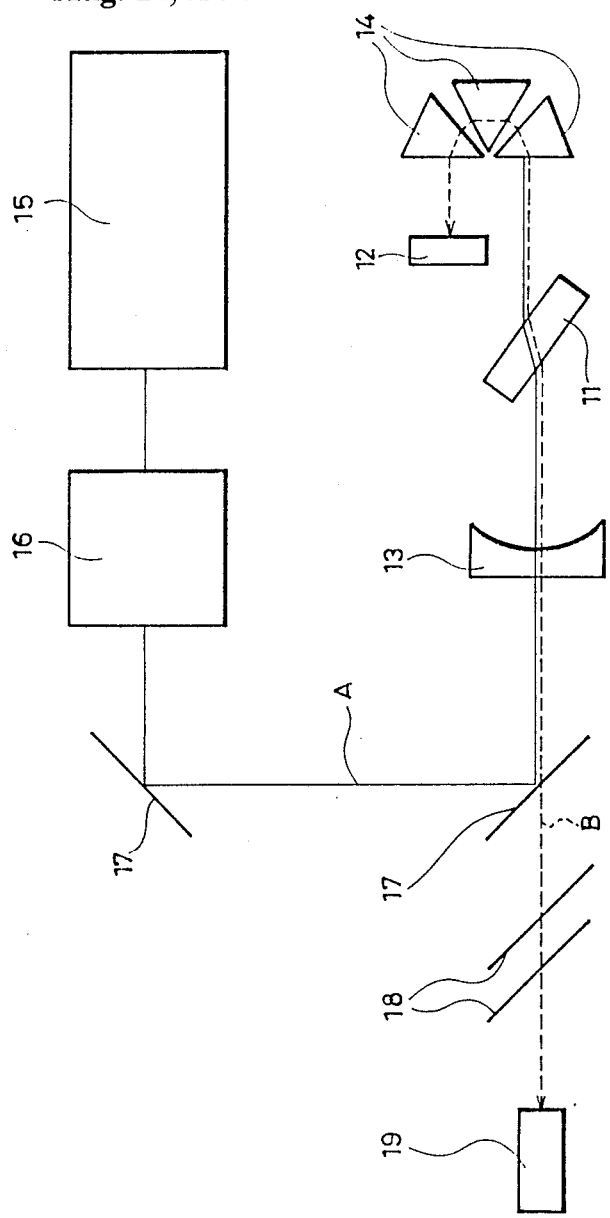
FIG. 4 is a schematic view of a laser system.

The No. 5 sample as prepared in Example 1 was arranged with a Brewster angle represented by the laser crystal 11 in FIG. 4. The total reflection mirror 12, the translucent mirror 13 and the prism 14 were also arranged as shown in FIG. 4 to constitute a resonator. An argon ion laser 15 and a dye laser 16 were used as a pumping light source. The argon ion laser 15 was used for pumping the dye laser 16. Since the dye laser 16 was capable of varying the wavelength, the laser light from the dye laser 16 was used as pumping light for the samples.

When the pumping light A was applied to the laser crystal 11 through the optical path including the deflection mirror 17, the laser light was amplified in the resonator constituted by the translucent mirror 13 the, total reflection mirror 12 and the prism means 14, and laser light was emitted. Stray light due to the pumping light was reduced by a filter 18, and the output and wavelength were measured by a power meter or wavelength measuring instrument 19.

When the pumping wavelength was varied to 500–1000 nm, laser action occurred in the range of 1000–1400 nm. It was in the region of 650–950 nm that laser intensity was high. Further, by setting the pumping wavelength of the dye laser 16 at 800 nm and moving the total reflection mirror 12, laser action occurred continuously in the region of 100–1400 nm.

Example 4

This example is an embodiment of claim 5.

Figure 5:
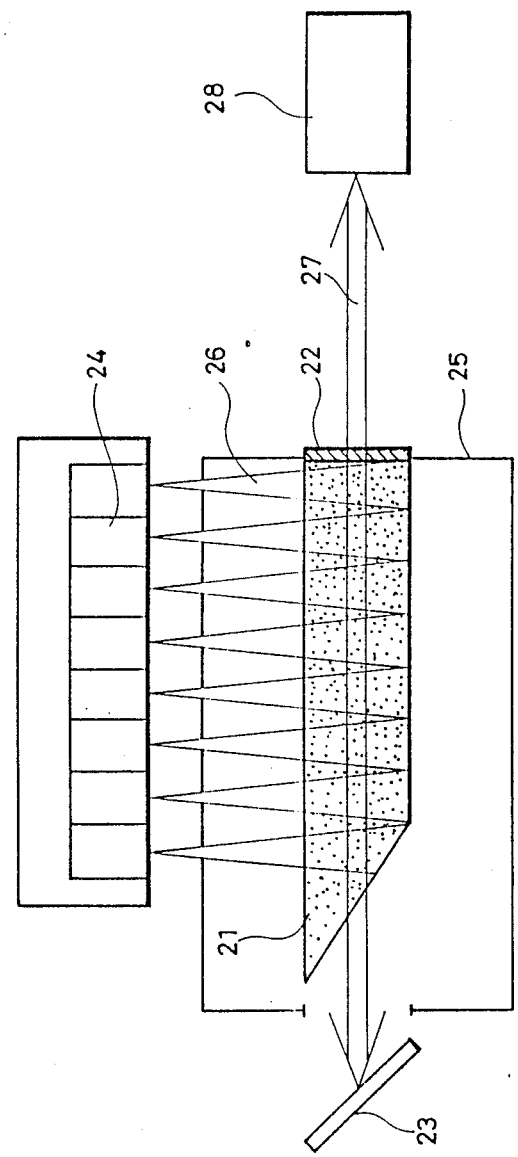
FIG. 5 is a schematic view of a laser system using semiconductor laser as pump source.

In this example, a laser apparatus shown in FIG. 5 was used and pumped by a semiconductor laser 24 in the form of an array. In FIG. 5, the numeral 21 denotes a laser crystal 25 denotes a condenser; 26 denotes exciting light; 27 denotes laser light; and 28 denotes a measuring instrument. Here, eight semiconductor lasers having a wavelength of 780 nm were used to form the semiconductor array 24.

First, to provide the laser crystal 21 shown in FIG. 5 a synthetic type Ib diamond was cut into a rod form having a diameter of 2 mm and a length of 10 mm, one longitudinal end surface being cut at the Brewster angle. The nitrogen concentration of the sample was $3.5 \times 10^{18}$ atoms/cm$^3$. The sample was subjected to electron irradiation at a dose of $1 \times 10^{19}$ electrons/cm$^2$ with 3 MeV. Thereafter an, ultrahigh pressure, high temperature annealing was carried out at 3.0 GPa and at 1800° C. respectively. The surface of the sample laser crystal 21 optically polished and then the vertical end surface was coated with a translucent film 22 as, shown in FIG. 5.

Further, the crystal 21 was placed in the condenser 25 and the pumping light 26 was incident on the crystal 21 through a hole in the condenser 25.

Wavelength selection was effected by adjusting the grating 23, whereby laser action occurred in the range 1000–1400 nm. In addition, the output power and laser wavelength were measured by a power meter or wavelength measurement 28.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A laser emitting synthetic diamond, comprising H2 centers with a maximum optical density in the direction of a pumping light within the range of 0.01 to 4 and a lasing ability in the range of 1000 to 1400 nm in response to an external pumping light having a wavelength within the range of 650 to 950 nm.

2. A method for producing H2 centers in a synthetic diamond for a laser emission, said synthetic diamond comprising H2 centers with a maximum optical density in the direction of a pumping light within the range of 0.01 to 4 and a lasing ability in the range of 1000 to 1400 nm in response to an external pumping light having a wavelength within the range of 650 to 950 nm, said method comprising the steps of:
    (a) selecting said synthetic diamond as an Ib-type to have a nitrogen concentration within the range of $1 \times 10^{17}$ to $8.5 \times 10^{19}$ atoms/cm$^3$,
    (b) subjecting said synthetic Ib-type diamond to an electron irradiation with a dose of not less than $5 \times 10^{17}$ electrons/cm$^2$, and
    (c) heat-treating said synthetic Ib-type diamond in a temperature range of 1400° to 1850° C. in a vacuum of not more than 1 Torr, or in an inert gas atmosphere.

3. A method for producing H2 centers in a synthetic diamond for a laser emission, said synthetic diamond comprising H2 centers with a maximum optical density in the direction of a pumping light within the range of 0.01 to 4 and a lasing ability in the range of 1000 to 1400 nm in response to an external pumping light having a wavelength within the range of 650 to 950 nm, said method comprising the steps of:
    (a) selecting said synthetic diamond as an Ib-type to have a nitrogen concentration within the range of $1 \times 10^{17}$ to $8.5 \times 10^{19}$ atoms/cm$^3$,
    (b) subjecting said type Ib diamond to electron irradiation with a dose of not less than $5 \times 10^{17}$ electrons/cm$^2$, and
    (c) heat-treating said synthetic diamond under ultrahigh pressure not less than 3.0 GPa and at a high temperature not less than 1500° C.

4. A method of controlling a laser emission of a laser emitting diamond comprising H2 centers with a maximum optical density in the direction of a pumping light within the range of 0.01 to 4 and a lasing ability in the range of 1000 to 1400 nm in response to an external pumping light having a wavelength within the range of 650 to 950 nm, said method comprising the steps of:
    (a) exposing said laser emitting diamond to said external laser pumping light, and
    (b) varying a laser wavelength in the range of 1000 to 1400 nm.

5. The method of claim 4, comprising the step of producing said external pumping light by means of a single semiconductor laser.

6. The method of claim 4, comprising the step of producing said external pumping light by means of a plurality of semicondutor lasers.

7. The method of claim 6, comprising the step of arranging said plurality of semiconductor lasers in an array.

* * * * *